US012640740B2

(12) United States Patent
Stauder et al.

(10) Patent No.: US 12,640,740 B2
(45) Date of Patent: May 26, 2026

(54) DEVICE AND METHOD FOR APPLYING A LOOK-UP TABLE

(71) Applicant: InterDigital CE Patent Holdings, SAS, Paris (FR)

(72) Inventors: Jurgen Stauder, Montreuil (FR); Patrick Morvan, Laille (FR); Anita Orhand, Rennes (FR)

(73) Assignee: InterDigital CE Patent Holdings, SAS, Paris (FR)

( * ) Notice: Subject to any disclaimer, the term of this patent is extended or adjusted under 35 U.S.C. 154(b) by 213 days.

(21) Appl. No.: 18/572,313

(22) PCT Filed: Jun. 21, 2022

(86) PCT No.: PCT/EP2022/066783

§ 371 (c)(1),
(2) Date: Dec. 20, 2023

(87) PCT Pub. No.: WO2022/268748

PCT Pub. Date: Dec. 29, 2022

(65) Prior Publication Data

US 2024/0213986 A1      Jun. 27, 2024

(30) Foreign Application Priority Data

Jun. 23, 2021    (EP) ..................................... 21305857

(51) Int. Cl.
H03K 19/17728        (2020.01)
(52) U.S. Cl.
CPC .............................. H03K 19/17728 (2013.01)

(58) Field of Classification Search
CPC ................................................. H03K 19/17728
See application file for complete search history.

(56) References Cited

U.S. PATENT DOCUMENTS

2009/0002782  A1*   1/2009  Kulkarni ................ H04N 1/603
                                                              358/518

FOREIGN PATENT DOCUMENTS

| EP | 0706287 | A2 | 4/1996 |
| EP | 2202584 | A2 | 6/2010 |
| EP | 2716028 | A0 | 4/2014 |
| EP | 3591955 | A1 | 7/2018 |
| RU | 2721762 | C2 * | 5/2020 | ........... H04N 19/186 |
| WO | 2022053417 | A1 | 3/2022 |

OTHER PUBLICATIONS

Translation of RU-2721762-C2 (Year: 2020).*

* cited by examiner

*Primary Examiner* — Henry Tsai
*Assistant Examiner* — John B Roche
(74) *Attorney, Agent, or Firm* — Condo Roccia Koptiw LLP

(57)          ABSTRACT
A device applies a pre-function to an input signal to obtain an intermediate signal, wherein the pre-function has a linear section part of the input range. The device then applies a LUT including LUT entries that define a linear section and that delimit the range of the intermediate signal that corresponds to the part of the input range, resulting in an output signal that can be linearly processed through the pre-function and the LUT. The device can process a signal with positive and negative values, where one of these lies in the part of the input range that results in linear processing.

20 Claims, 5 Drawing Sheets

DEVICE AND METHOD FOR APPLYING A LOOK-UP TABLE

CROSS REFERENCE TO RELATED APPLICATIONS

This application is a U.S. National Stage Application under 35 U.S.C. § 371 of International Patent Application No. PCT/EP2022/066783, filed Jun. 21, 2022, which is incorporated herein by reference in its entirety.

This application claims priority to European Application No. 21305857.1, filed Jun. 23, 2021, which is incorporated herein by reference in its entirety.

TECHNICAL FIELD

The present disclosure relates generally to signal processing and in particular to signal processing using lookup tables (LUTs).

BACKGROUND

This section is intended to introduce the reader to various aspects of art, which may be related to various aspects of the present disclosure that are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

It is well known to apply a lookup table (LUT) calculated from a main function $f(x)$ to an input signal x instead of applying the main function itself, for example to speed up processing. The LUT is typically generated by regular sampling of the main function.

As an illustrative example, the main function is an exponential function $f(x)=(10^x-1)/9$ for a one-dimensional signal x in the range [0;1]. In the example, it is assumed that the LUT is a one-dimensional, regular LUT of size 3 having a LUT input grid {0; 0.5; 1}. The LUT entries are {$f(0)$; $f(0.5)$; $f(1)$}={0; $(10^{0.5}-1)/9$; 1}={0; 0.24; 1}.

The skilled person will appreciate that these principles apply to other signals, such as audio and video signals, for example two-dimensional chromaticity signals, three-dimensional color coordinates or n-dimensional signals in an n-dimensional signal space. These principles also apply to non-regular LUTs, for example having a LUT entry grid {0; 0.4; 1} with non-regular intervals of 0.4 and 0.6, respectively.

Since LUTs typically have limited size, and thus typically less LUT entries than the possible number of signal values, in which case their application to signals usually requires interpolation. Vandenberg and Andriani review some interpolation methods in their paper entitled "A Survey on 3D-LUT Performance in 10-bit and 12-bit HDR BT.2100 PQ" presented at SMPTE in 2018.

Generally speaking, to perform interpolation, in a first step, the input signal is interpolated from the LUT input grid. Often linear interpolation is applied, but the same principles apply to non-linear interpolation. In the above example, if the input signal is x=0.2, linear interpolation could use the first two grid values leading to the following interpolation: $x=0.2=c_1 0+c_2 0.5$ where 0 and 0.5 are the first two values of the LUT input grid, respectively, and $c_1=0.6$; $c_2=0.4$ are the linear interpolation coefficients. In a second step, the output signal LUT(x) is interpolated from the LUT entries. Usually the same interpolation method as in the first step is used. In the example, linear interpolation is used in the first step. Assuming that linear interpolation is used also for the second step and that, as is usual, the same interpolation coefficients are used, this gives the output signal LUT(x)=$c_1 0+c_2 0.24$. However, other coefficients and other interpolation methods can be used to derive LUT(x) from the LUT entries.

If the main function is non-linear and the interpolation of the LUT entries is linear, the effect of applying the LUT is like a piecewise interpolation of the main function. If a main function f(x) is sampled and saved in a LUT, the application of the LUT to a signal x using linear interpolation can be written as a LUT application function $LUT(x)=PL_x(f(x))$ where $PL_x( )$ is piecewise linearization on a grid of signal values x. For example, if the LUT is three-dimensional, well-known linear interpolation methods include trilinear, prism and tetrahedral interpolation.

It is also well-known to apply a pre-function to a signal before applying a LUT. A pre-function is usually a monotonously increasing function. The pre-function may itself being applied using a look-up-table, in the following called pre-LUT. The pre-function is typically one-dimensional. If the LUT is multi-dimensional, a one-dimensional pre-function can be applied to each of the signal coordinates, i.e. to each dimension. However, a pre-LUT can also be multi-dimensional. For example, a three-dimensional LUT designed for a three-dimensional input signal could be preceded by a two-dimensional pre-LUT for the first two channels and a one-dimensional pre-LUT for the third channel. Also, not all channels may be processed using a pre-LUT or a pre-function. For example, a two-dimensional LUT designed for a two-dimensional input signal may be preceded by a one-dimensional pre-function for the first channel, only, while the second channel is directly input to the LUT. In order to simplify the description, in the following, the case of a one-dimensional LUT and a one-dimensional pre-function is considered, but it will be appreciated that the principles can be extended to higher dimensions. When applying a pre-function Q(x) to a signal, the signal range of Q(x) is often equal to the signal range of the signal x itself. For example, in case of this one-dimensional pre-function, if input values are within the range [0;1], the application of the pre-function will yield values that are also within the range [0;1]. However, pre-functions can also include a change of range. For example, a one-dimensional input signal in the range [0;220] can have a range of [0;1] after application of the pre-function. In the following, for simplicity, it is assumed that pre-functions preserve the signal range. However, all principles also apply to pre-functions that do not preserve the signal range.

A common reason for applying a pre-function is to reduce and/or to reshape LUT interpolation errors. As soon as the sampling of the main function on the LUT input grid resulting in the LUT entries does not fully represent the main function in the sense of sampling theory, any interpolation applied to the LUT entries will usually generate LUT interpolation errors. For example, if linear interpolation is used to apply the LUT to the input signal and if the main function is non-linear, interpolation errors will cause that the resulting LUT application function LUT(x) is not equal to the main function itself. In order to reduce and/or to reshape the resulting LUT interpolation errors, the pre-function can be designed using multiple criteria.

A first criterion for designing a pre-function Q(x) is the non-linear shape of the main function itself. In this case, the pre-function Q(x) preferentially has a slope Q'(x)>1 for a range of input values x where the main function f(x) is steep, i.e. where |f'(x)|>1. Hereby, the LUT interpolation error is reduced in this range or input values; however, LUT interpolation error increases for other input values. This is called reshaping of LUT interpolation error.

Another criterion for designing the pre-function is to increase the precision of the output signal—in other words to reduce LUT interpolation errors—for a certain range of input values x that is important for an application case. This can be achieved by a pre-function Q(x) having a slope Q'(x)>1 for this range of input values. For example, for a video signal, this can be applied to small input values since the human visual system is more sensible for small luminance values.

Examples of well-known pre-functions are logarithmic, exponential and sigmoid functions, but other functions may also be used.

The application of a pre-function Q(x) to a signal x will result in a signal w=Q(x). After application of the pre-function, generally the LUT is applied to the signal w resulting in LUT(w). The process of applying a pre-function and a LUT to a signal x can be denoted as LUT(Q(x)). Usually this solution replaces the direct application of a given main function f(x) to the signal, which means that it is preferred that LUT(Q(x)) is as close to f(x) as possible. If a pre-function is applied before the LUT, the pre-function has to be considered within the LUT in order to satisfy this preference. The consideration of the pre-function within the LUT can be achieved using several known methods, one of which will now be described.

An example of a method of considering the pre-function within the LUT and making LUT(Q(x)) close to f(x) is to inverse the pre-function Q(x) within the LUT, which gives a new, adapted lookup table $LUT_Q$ such that $LUT_Q(w)=PL_w$ $(f(Q^{-1}(w))$ where $PL_w$ is piecewise linearization based on a regular sampling of w. With w=Q(x) follows that $LUT_Q(Q(x))=PL_w(f(x))$ and therefore close to f(x) up to piecewise linearization. The function $f_w(w)=f(Q^{-1}(w))$ is called in the following "concatenated function" or "adapted function". It can be said that the adapted lookup table $LUT_Q$ can be derived from the adapted function $f_w(w)$ by sampling in w in the same way as a common lookup table LUT is derived from a common main function f(x) by sampling in x. The advantage of using the pre-function is that regular sampling is done on the signal w instead of x. The errors of interpolation are regularly distributed over the range of w, but irregularly distributed over the range of x. Depending on the pre-function, errors can be reduced in certain parts of the range of x and increased in other parts, this is called error shaping. In other words, the pre-function changes the regularly sampled lookup table LUT(x) into a combination of pre-function and adapted lookup table denoted as $LUT_Q(Q(x))$ where this combination corresponds to a non-regular sampling of x.

For example, if the pre-function is a logarithmic function $Q(x)=\log_2(x+1)$, the inverse pre-function is $Q^{-1}(w)=2^w-1$. Then, the entries of the adapted look-up-table $LUT_Q$— derived according to the above example of a method of considering the pre-function—are $\{f(Q^{-1}(0); f(Q^{-1}(0.5));$ $f(Q^{-1}(1))\}=\{0; 0.41; 1\}$. When applying the LUT, the input signal values within a first interval between 0 and $Q^{-1}(0.5)$ =0.41 are transformed using the first and second LUT entries, while input signal values within a second interval between $Q^{-1}(0.5)=0.41$ and 1 are transformed using the second and third LUT entries. The benefit of the pre-function is that the signal values within the first interval will, in general, have higher precision, since the interval is smaller and the sampling is more dense. Higher precision means a smaller LUT application error E=f(x)−$LUT_Q$(Q(x)). This is the error introduced when representing the main function f(x) as a LUT or as concatenation of a pre-LUT and a LUT while applying it to the input signal. More specifically, the LUT application error is the difference between result of application of pre-function and LUT to the signal compared to the result of application of the main function itself to the signal. The reason why—in general—the LUT application error is smaller for signal values in the first interval is that the first interval is smaller. Hereby, the density of LUT entries per signal range—which corresponds to the sampling rate—is higher and the signal values are transformed with less LUT application error than the values in the second interval.

In certain cases, it can be desired to have a LUT in which an input signal is (slightly) modified but not affected by LUT interpolation errors for specific parts of the range of the input signal, while the input signal is modified and affected by LUT interpolation errors for other parts of the range.

It will thus be appreciated that there is a desire for a solution that addresses at least some of the shortcomings related to LUTs. The present principles provide such a solution.

SUMMARY OF DISCLOSURE

In a first aspect, the present principles are directed to a method comprising applying a pre-function to an input signal to obtain an intermediate signal, the pre-function comprising a first part and a second part respectively corresponding to a first part and a second part of a range of the input signal, wherein the pre-function is linear in the second part, and applying a Look-Up Table, LUT, to the intermediate signal to obtain an output signal, wherein the LUT corresponds to the pre-function and comprises a first part and a second part, wherein the second part is a linear part that comprises entries that delimit a range of the intermediate signal that corresponds to the second range of the input signal.

In a second aspect, the present principles are directed to a device comprising memory configured to store processor-executable program code instructions and at least one hardware processor configured to execute the program code instructions to apply a pre-function to an input signal (x) to obtain an intermediate signal (w), the pre-function comprising a first part and a second part respectively corresponding to a first part and a second part of a range of the input signal, wherein the pre-function is linear in the second part and apply a Look-Up Table, LUT, to the intermediate signal to obtain an output signal (z), wherein the LUT corresponds to the pre-function and comprises a first part and a second part, wherein the second part is a linear part that comprises entries that delimit a range of the intermediate signal that corresponds to the second range of the input signal.

In a third aspect, the present principles are directed to a computer program product which is stored on a non-transitory computer readable medium and includes program code instructions executable by a processor for implementing the steps of a method according to any embodiment of the first aspect.

BRIEF DESCRIPTION OF DRAWINGS

Features of the present principles will now be described, by way of non-limiting example, with reference to the accompanying drawings, in which.

DESCRIPTION OF EMBODIMENTS

Figure 1:
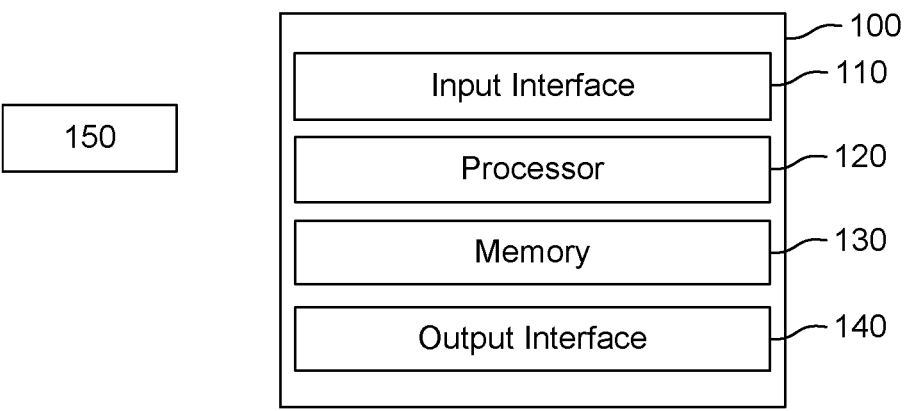
FIG. 1 illustrates a device according to an embodiment of the present principles.

FIG. 1 illustrates a device 100 according to an embodiment of the present principles. The device 100 includes at least one input interface 110 configured to receive a signal, at least one hardware processor 120 ("processor") configured to, among other things, control the device 100, process received signals, and execute program code instructions to perform at least one method of the present principles. The device 100 also includes memory 130 configured to store the program code instructions, execution parameters, at least one lookup table (LUT), and so on, and at least one output interface 140 configured to output processed (output) signals. A non-transitory computer readable medium 150 stores program code instructions that, when executed by a processor (e.g. processor 120), implement the steps of a method according to at least one embodiment of the present principles.

In the embodiments described hereinafter, it is assumed that the input signal x is obtained, for example from an external device (not shown), retrieved from memory or as a result of internal calculations, and that the result can be output to another device or used by the device itself, for example in further calculations.

Figure 2:
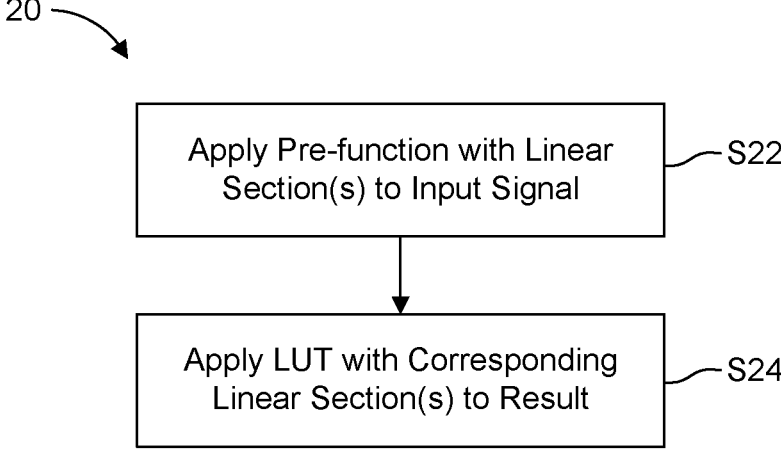
FIG. 2 illustrates a signal processing method according to an embodiment of the present principles.

FIG. 2 illustrates an embodiment of a signal processing method 20 according to the present principles. In step S22, a pre-function with linear section(s) is applied to an input signal to obtain a result, for example by at least one processor. In step S24, a corresponding LUT with corresponding linear section(s) is applied to the result to obtain an output, for example by the at least one processor, that can be output (e.g. sent or transmitted to memory or at least one further device).

The linear section(s) in the pre-function and the LUT are arranged so that the output equals the input in case the input is in a range corresponding to a linear section. Depending on the slope of the linear sections, the equality can be strict or approximate (i.e. at least for certain values including rounding errors).

Figure 3:
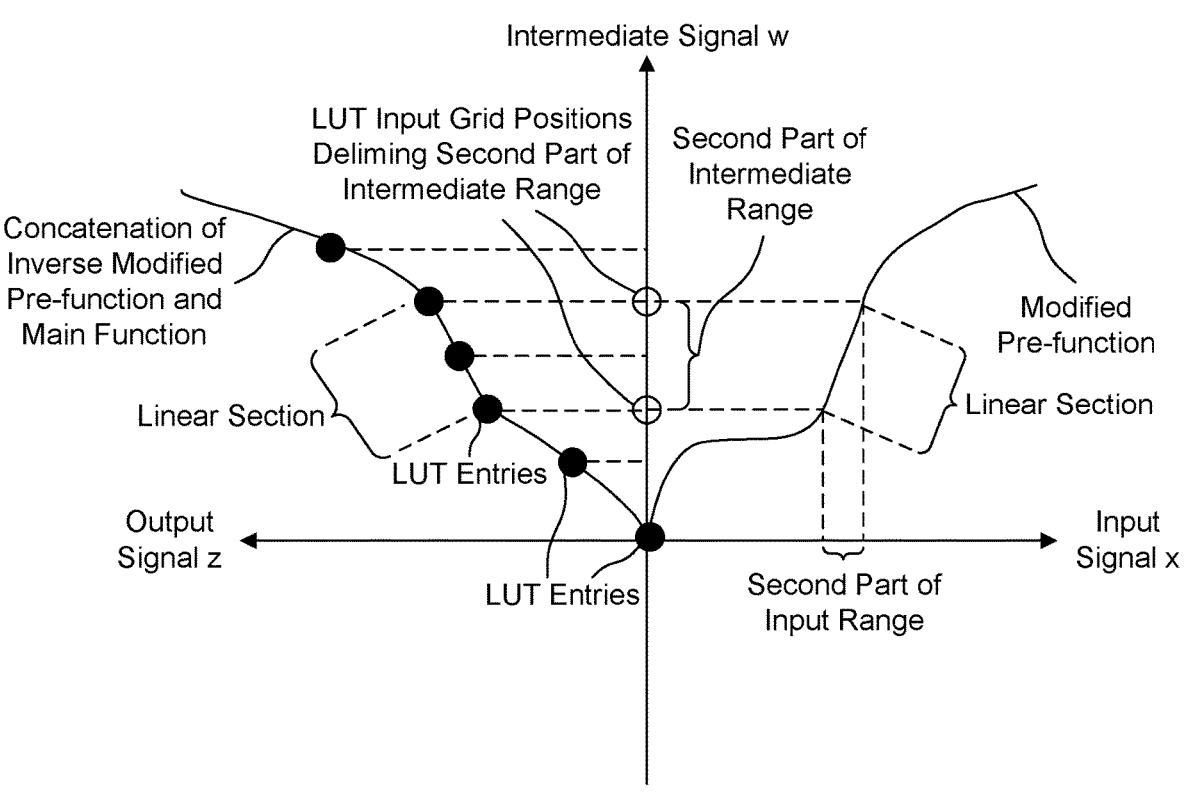
FIG. 3 illustrates an example of a pre-function and LUT entries according the present principles.

FIG. 3 illustrates an example of a pre-function and LUT entries according the present principles. The figure depicts axes for three signals: an input signal x (horizontal to the right), an intermediate signal w (vertical upwards) and an output signal z (horizontal to the left). Also depicted are a pre-function and LUT entries.

The range of input signal x has at least one first part and at least one second part, where the processing is transparent for input values in the at least one second part.

A pre-function, preferably monotonously increasing, similarly includes at least one first part and at least one second part, respectively corresponding to the parts of the range of the input signal. For a first part, the pre-function can be of any conventional type, for a second part, the pre-function is linear and can have a slope of 1.

The output of the pre-function is an intermediate signal w, whose range has parts corresponding to the parts of the range of the input signal x, i.e. at least one first part and at least one second part.

The LUT entries can correspond to samples of a function such as a concatenation of an inverse pre-function and a main function. The function includes parts that correspond to the parts of the range of the intermediate signal w, notably at least one linear section that corresponds to the second part of the range of the intermediate signal w. For a linear section, there are, for each dimension of the signal, at least two LUT entries that correspond to the delimiting values of a second part of the range of the intermediate signal w; a linear section can further include at least one intermediate LUT entry. In case a linear section includes three or more entries, these can be regularly or irregularly spaced.

Application of the LUT generates an output signal z whose range has parts corresponding to those of the intermediate signal w and the input signal x. Notably a second part of the range of the output signal corresponds to the second part of the range of the respective input signal x. This permits the output values to be a transparently processed version of the input values for a second part of the range. For example, the transparently processed version of the input signal can be equal to the input signal. It is again noted that the equality can be strict or allowing for arithmetic rounding errors due to limited precision of floating point numbers, but does exclude LUT interpolation errors.

Figure 4:
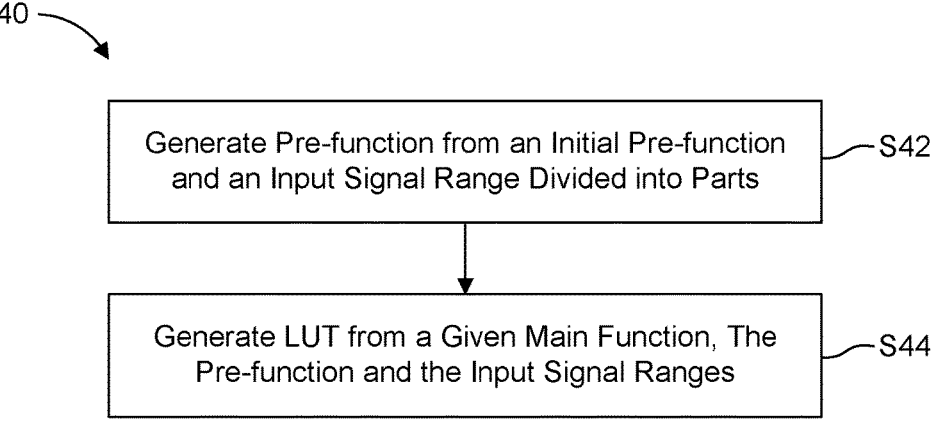
FIG. 4 illustrates a method of pre-function and LUT generation according to an embodiment of the present principles.

FIG. 4 illustrates a method 40 of pre-function and LUT generation and application according to an embodiment of the present principles.

In step S42, a device generates a pre-function from an initial pre-function and an input signal range divided into at least one first part and at least one second part. As before, application of pre-function and LUT is to be transparent for input values in the second part of the input signal range.

The pre-function is generated by inserting into the initial pre-function a linear section for the at least one second part. As mentioned, the slope of a linear section can be a slope of 1.

The device can further divide the input signal range into the at least one first part and the at least one second part.

In step S44, the device generates a LUT from a given main function, the pre-function and the first and second parts of the input signal range.

In at least one first part of the LUT, corresponding to the at least one first part of the range of the intermediate signal, the LUT entry or entries can be calculated using conventional LUT generation methods, i.e. using the inverse pre-function followed by the main function such that the application of the pre-function followed by the application of the LUT maps said first part of input signal range to a first part of output signal range according to the main function up to LUT interpolation errors.

In the at least one second part of the LUT, corresponding to the at least one second part of the range of the intermediate signal, the LUT entries include at least two entries that correspond to the delimiting values of the corresponding range of the intermediate signal. It will be understood that the second part of the LUT can include three or more entries. The LUT entries in a second part build a linear section such that the LUT using linear interpolation maps the at least one second part of the range of the intermediate linearly to at least one second part of the output range.

In other words, the signal processing, i.e. the pre-function and the LUT, establishes a linear pathway for each second part of the range of the input signal so that input signal values in such a range is transformed in a transparent or linear way without any LUT interpolation error (although they can be subject to arithmetic rounding errors).

The dimension of the input signal, of the pre-function and of the LUT may be one or greater. Furthermore, the dimensions of input signal, pre-function and LUT may be different. For example, the input signal may be four-dimensional, the LUT may be four-dimensional, but the pre-function two-dimensional and applied only to two of the four dimensions of the input signal.

A second part of the input signal range may be characterized by a reduced or increased number of dimensions. For example, if the input signal is four-dimensional having a four-dimensional input signal range, the second part of the input signal range may be one-, two-, three-, or four-dimensional.

Furthermore, a second part of the input signal range may have minimum and/or maximum values in one or more dimensions. For example, for a three-dimensional RGB signal for red, green and blue color coordinates of an image, having a signal range in each of the three dimensions of [0,1] the second part of the input signal range may be limited in the first dimension of the red color coordinate to [0:0.1]. Furthermore, a second part of the input signal range may be delimited by a cross-dimensional border, for example delimiting all input signal values having a sum of the coordinates of the two dimensions larger than 0,5.

As already mentioned, there are LUT input grid values corresponding to the delimiting values of a second part of the intermediate range. This allows to map a second part of the input signal linearly into a second part of the intermediate range using the pre-function. If the LUT has a linear section and is applied using linear interpolation, this can further allow to map the second part of the intermediate range linearly to a second part of the output signal.

As in any embodiment, the pre-function can be implemented as a LUT ("pre-LUT"), in which case the linear section in the pre-LUT should be delimited in the input signal range by pre-LUT input grid values. If linear interpolation is used for the application of the pre-LUT to the input signal, the pre-LUT will show within the second part of the input signal range a fully linear behavior without any pre-LUT interpolation error in the same way as the pre-function itself does.

In case non-linear interpolation is used for applying the LUT, the linear section in the modified pre-function can be replaced by a specific section derived from the inverse of the LUT interpolation function. This can enable the concatenation of the specific section of the pre-function to compensate for the non-linear LUT interpolation, resulting in a linear pathway.

In an embodiment, the pre-function is generated by making it identical to an obtained initial pre-function for at least a first part of the input signal range. This can allow the linear pathway for that said at least one second part of the input signal range to be established in any workflow using a pre-function and a Look-Up-Table.

Implementation Example 1

In this illustrative, non-limitative example, large input signal values are modified in a pure linear way without LUT interpolation errors while other signal values are transformed according to a given main function. In this example, the input signal is three-dimensional representing the coordinates R, G, B of an image signal for red, green and blue, respectively. It is assumed that a main function f(x) that transforms the image is given. The input signal range is characterized by R,G,B coordinates being all within [0;1]. In this example, the main function does not change the signal range.

A pre-function P(u) is built from an initial pre-function Q(u). In the example, the initial pre-function is given according to the application and does not change the signal range. The pre-function can be of various types. For example, if the application requires LUT interpolation errors to be smaller for small signal values than for higher values, a logarithmic pre-function $Q(u)=\log_2(u+1)$ can be applied to all channels R, G, B of the input signal resulting in an intermediate signal w.

In the example, the pre-function is identical to the initial pre-function for a given first part of the input signal range. In the example, the first part of the input signal range is characterized by R,G,B coordinates each within [0; m] with m≤1 and thus not including the largest input values, i.e. ]m, 1].

It is noted that the pre-function could also be defined from other functions than the initial pre-function, for example from a function $f(u)=\tan(u)$. The function f(u) is not a pre-function since it is not invertible. However, in order to build the pre-function, an invertible part of f(u), for example in the range [0;0.1], could be used.

Then, a second part of the input signal range that is mapped by a modified pre-function to a second part of the intermediate range that is delimited by LUT input grid values is defined. If a LUT with a 17×17×17 LUT input grid is chosen, this gives 17 values {0, 1/16, 2/16, . . . 15/16, 1} for each of the R,G,B coordinates of the intermediate signal w. In this example, the sampling is regular in w; however, sampling can be irregular in other applications. In this example, the second part of the intermediate range is chosen to be the signal values having R,G,B coordinates within the interval ]15/16; 1] that is delimited by the LUT grid coordinates 15/16 and 1, respectively. It this case, the second part of the input signal range is characterized by input signal coordinates within $]Q^{-1}(15/16); Q^{-1}(1)]$. This pre-function does not change the signal range and $Q^{-1}(1)=1$. The second pre-function is identical to the first pre-function for the first part of the input signal range characterized by coordinates within $[0; Q^{-1}(15/16)]$ while it includes a linear section that maps the second part of the input signal range to the second part of the intermediate range. The second pre-function is linear in the second part of the input signal range according to $$P(u) = \frac{15}{16} + \frac{1 - \frac{15}{16}}{1 - Q^{-1}\left(\frac{15}{16}\right)}\left(u - Q^{-1}\left(\frac{15}{16}\right)\right) \vee \frac{15}{16} < u \leq 1.$$

Through this choice of the second pre-function, high values of the input signal are modified only in a linear way by the second pre-function.

Further, a LUT is built. LUT entries that are not in the second part of the intermediate range are calculated from the inverse pre-function followed by the main function. This well-known principle consists of sampling the modified main function f'(w)=f(w') where w' is obtained by applying the inverse pre-function $P^{-1}( )$ to all channels of w. It is well known that by this procedure the output signal is $LUT_P(w)$ =$PL_w$(f(w')) where $PL_w$ is piecewise linearization based on a regular sampling of w. This way, the application of the pre-function followed by the application of the LUT maps said first part of input signal range to a first part of output signal range according to the main function up to LUT interpolation errors.

LUT entries within the second part of the intermediate range are used to create a linear section within the LUT. In the example, the second part of the intermediate range contains signal values having R,G,B coordinates within the interval ]15/16; 1] that is delimited by the LUT grid coordinates 15/16 and 1, respectively. In this example, all LUT entries with LUT input grid coordinates smaller or equal than 15/16 are already determined. The remaining LUT entries having at least one input grid coordinate with value 1 are used to form a linear section. Since the second part of the intermediate range does not contain other LUT entries than those delimiting the second part of the intermediate range, the LUT entry determination is straightforward. By using linear interpolation when applying the LUT, the second part of the intermediate range is mapped linearly to a second part of the output range.

During signal processing, the pre-function and the LUT are applied to the input signal. Those coordinates from the input signal that are within the second part of input signal range i.e. larger than $Q^{-1}(15/16)$ are passed through to the output signal in a linear manner without LUT interpolation error.

Implementation Example 2

In this illustrative, non-limitative example, small input coordinates are to pass (at least essentially) unchanged and without any LUT interpolation error through the LUT. As in implementation example 1, the input signal consists of three-dimensional R,G,B coordinates in the range [0;1], and an initial pre-function Q(u) is given.

The modified pre-function is identical to the given pre-function for a given first part of the input signal range. In this example, the first part of input signal range is characterized by R,G,B coordinates each within [m; 1] with 0<m<1 and thus not including the smallest input values. As already described, the pre-function can also be defined from other functions.

A second part [0;m] of the input signal range that is mapped by the modified pre-function to a second part of the intermediate range that is delimited by LUT input grid values is defined. As in the first implementation example, the LUT has a 17×17×17 LUT input grid. The second part of the intermediate range is chosen to be the signal values having R,G,B coordinates within the interval [0; 1/16[that is delimited by the LUT grid coordinates 0 and 1/16, respectively. In this case, the second part of the input signal range is characterized by input signal coordinates within [$Q^{-1}(0)$; $Q^{-1}(1/16)$] and m=$Q^{-1}(1/16)$. In this example, this pre-function does not change the signal range and Q(0)=0 and Q(1)=1. The pre-function is identical to the given pre-function for the first part of the input signal range characterized by input signal coordinates within [$Q^{-1}(1/16)$; 1]. A linear section maps the second part of the input signal range [0; $Q^{-1}(1/16)$] to the second part of the intermediate range [0; 1/16[by the following linear function:

$$w = \frac{1/16}{Q^{-1}(1/16)}x$$

Small values of the input signal are thus modified only in a linear way by the pre-function.

The 17×17×17 LUT is then built. The LUT input grid positions and corresponding LUT entries are classified into the following classes:

PathwayBottomRedGreen: grid positions where the blue input grid coordinate equals zero;

PathwayBottomGreenBlue: grid positions where the red input grid coordinate equals zero;

PathwayBottomBlueRed: grid positions where the green input grid coordinate equals zero;

PathwayBorderRedGreen: grid positions where the blue coordinate equals 1/16;

PathwayBorderBlueRed: grid positions where the green coordinate equals 1/16;

PathwayBorderGreenBlue: grid positions where the red coordinate equals 1/16; and Mainstream positions: remaining grid positions.

The mainstream positions are not in the second part of the intermediate range and are calculated from the inverse pre-function followed by the main function, as is known in the art. The other LUT entries that transform the first part of the intermediate range are determined as follows:

1. PathwayBorderRedGreen: from the main function and the pre-function as described for the second intermediate range, but with the blue coordinate set to m;

2. PathwayBorderBlueRed: from the main function and the pre-function as described, but with the green coordinate set to m;

3. PathwayBorderGreenBlue: from the main function and the pre-function as described, but with red coordinate set to m;

4. PathwayBottomRedGreen: same value as the closest LUT entry belonging to PathwayBorderRedGreen, but the blue coordinate is set to zero;

5. PathwayBottomBlueRed: same value as the closest LUT entry belonging to PathwayBorderBlueRed, but the green coordinate is set to zero;

6. PathwayBottomGreenBlue: same value as the closest LUT entry belonging to PathwayBorderGreenBlue, but the red coordinate is set to zero.

In this way, 1 and 4 build a linear segment for the blue channel that maps blue coordinates within [0; 1/16[to [0;m]. In the same way, 2 and 5 as well as 3 and 6 build linear segments for the green or red coordinates, respectively.

The input signal is processed by application of the pre-function and the LUT. The coordinates from the input signal that are within the second part of input signal range, i.e. smaller than m=$Q^{-1}(1/16)$, are passed through to the output signal in a linear manner without LUT interpolation error. The absence of interpolation error is explained by the fact that LUT interpolation is linear and the intended behaviour for blue, green and red coordinates is linear, too.

Implementation Example 3

A variant can be applied if the main function contains cross talk. Cross talk is present—for example—if application of the main function to an input signal with RGB coordinates {R>0, G>0, B=0} gives an output signal with the blue coordinate different from zero. Such cross talk in the blue coordinate would be clamped—according to implementation example 2 as soon as the blue coordinate is set to m for the LUT entries belonging to PathwayBorderRedGreen. Therefore, in this variant, LUT entries belonging to one of PathwayBorderRedGreen, PathwayBorderBlueRed, or PathwayBorderGreenBlue are determined from the inverse pre-function followed by the main function as described for step S404. These are the LUT input grid positions that define the border between the first part and the second part of the intermediate signal range. In this case, an input signal with all three coordinates within [0;m] will be transformed linearly into output signal with all three coordinates within [0;m] without LUT interpolation error. In other words, such an input signal can come out unchanged. However, an input signal with at least one coordinates within [0;m] and at least one coordinate outside [0;m], will be impacted by the cross talk of the main function, as intended in this Implementation example 3.

In implementation examples 1 to 3, the input signal consists of three-dimensional R,G,B coordinates. It will however be appreciated that the input signal is not limited to such signals. The present principles can be used for example to compensate the temperature drifts of a radar sensor measuring distance for automotive applications, to compensate for temperature errors of an Inertial Measurement Unit (IMU) of for example smartphones or tablets, or for calibration of moisture sensors to compensate for temperature variations. It is also possible to use the present principles to compensate for drifts due to aging overtime or to mechanical stress.

Figure 5:
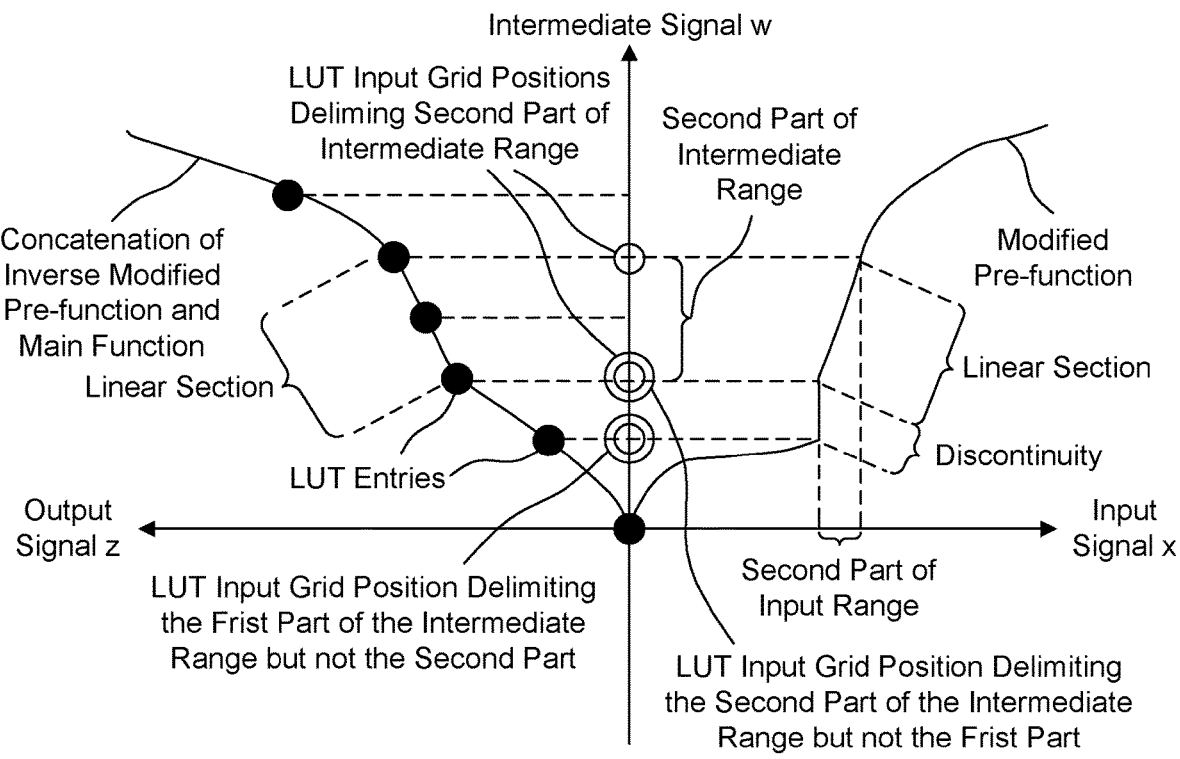
FIG. 5 illustrates an embodiment of the present principles.

FIG. 5 illustrates an embodiment of the present principles according to which the pre-function is characterized by at least one discontinuity at the transition between a first part of the input signal range and at least one second part of the input signal range such that the discontinuity in the intermediate signal is delimited by LUT input grid positions.

In other words, the discontinuity in the pre-function allows the use of different LUT entries for the linear pathway the rest of the input signal, respectively, as will be described.

The discontinuity in the intermediate signal can be delimited by neighboring LUT input grid positions such that there are no LUT input grid positions within the discontinuity in the intermediate range.

An effect of such a discontinuity is that the set of LUT input grid positions used for mapping the at least one second part of the intermediate signal range is distinct from the LUT input grid positions used for mapping of the rest of the intermediate signal range. This can allow, even in presence of cross talk in the main function, definition of the linear pathway with all degrees of liberty.

FIG. 5 illustrates the discontinuity of the pre-function for an example of a one-dimensional pre-function and a one-dimensional LUT. The LUT input grid position delimiting the second part of the intermediate range does not delimit the first part. Conversely, a LUT input grid position delimiting the first part of the intermediate range does not delimit the second part. The discontinuity allows to control the behavior of the overall mapping independently for the first and second parts of the input signal.

As before, the pre-function incorporates at least one linear section mapping at least one second part of the input signal range to at least one second part of the intermediate signal range that is delimited by LUT input grid values. The discontinuity at the transition of a first part of the input signal range and at least one second part of the input signal range is then connective to the linear section.

It is noted that if the pre-function contains a discontinuity, it is no longer invertible. However, when calculating LUT entries from the inverse pre-function and the main function, the discontinuity part of the modified pre-function does not need to be inverted. As illustrated in FIG. 5, the discontinuity is situated between two LUT entries. In order to calculate the first of these two LUT entries, the limit of the inverse pre-function when approaching the discontinuity from one side is used. In order to calculate the second of these two LUT entries, the limit of the inverse pre-function when approaching the discontinuity from the other side is used.

Implementation Example 4

In implementation example 4, the goal is to pass small input coordinates unchanged and without interpolation error through the LUT even if the main function has cross talk. As in example 3, the input signal is made up of three-dimensional R,G,B coordinates in the range [0;1]. A one-dimensional initial pre-function Q(u) is given and is used to build a pre-function, as already described. In addition, a discontinuity will be introduced into the pre-function.

The pre-function is identical to the initial pre-function for a given first part of the input signal range. In this example, the first part of input signal range is chosen to be characterized by R,G,B coordinates each within [m; 1] with 0<m<1 and thus not containing the smallest input values. However, as already described, the pre-function can also be defined from other functions.

A second part [0;m] of the input signal range is mapped by the pre-function to a second part of the intermediate range that is delimited by LUT input grid values. In this example, the LUT has a 32×32×32 LUT input grid. The second part of the intermediate range is chosen to be the signal values having R,G,B coordinates within the interval [0; 1/32[that is delimited by the LUT grid coordinates 0 and 1/32, respectively. In this case, the second part of the input signal range is characterized by input signal coordinates within [Q⁻¹(0); Q⁻¹(1/32)] and m=Q⁻¹(1/32). In this example, this pre-function does not change the signal range and Q(0)=0 and Q(1)=1. A linear section is introduced into the pre-function that maps the second part of the input signal range [0; Q⁻¹(1/32)] to the second part of the intermediate range [0; 1/32[by the following linear function:

$$W = \frac{1/32}{Q^{-1}(1/32)}x$$

By this choice of the second pre-function, small values of the input signal are modified only in a linear way by the second pre-function.

Figure 6:
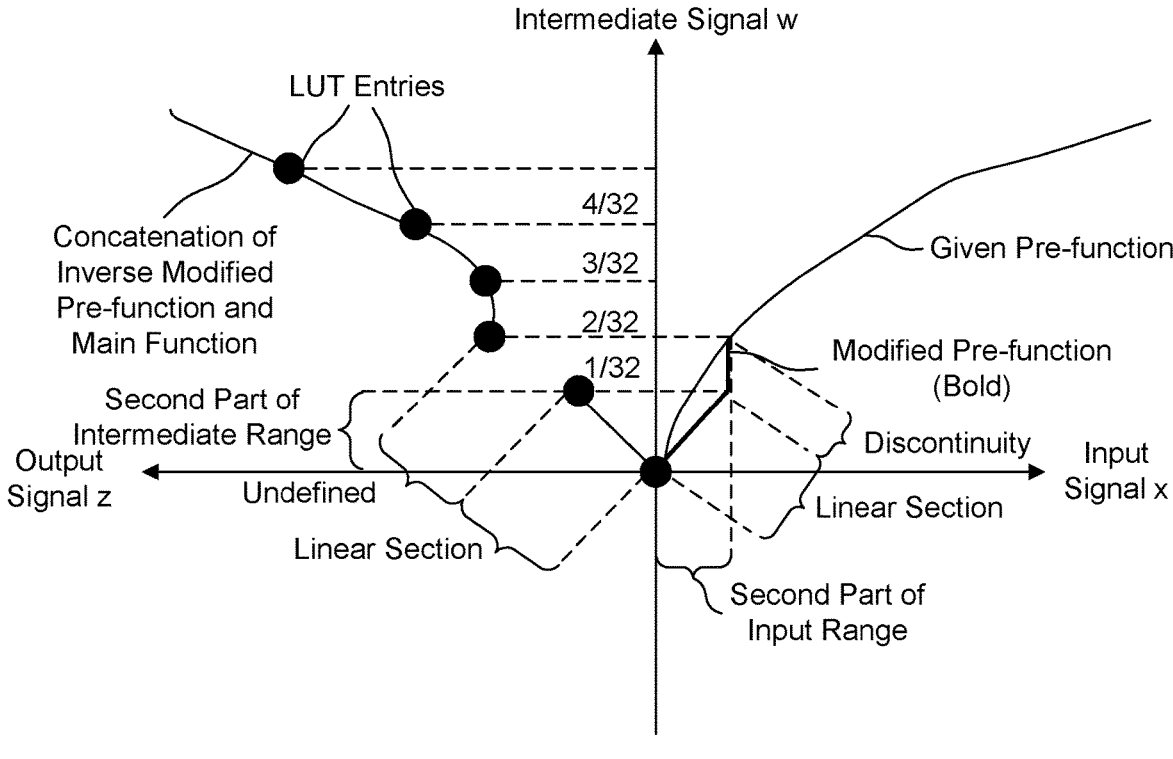
FIG. 6 illustrates an embodiment of the present principles.

A discontinuity is introduced into the pre-function shown in FIG. 6 projected to either one of the three coordinates red, green or blue. For illustrative reasons, FIG. 6 is illustrated in one dimension, but the LUT is three-dimensional. The discontinuity is delimited in the intermediate signal range by two LUT input grid positions 1/32 and 2/32. The first part of the intermediate range is [2/32;1] and the second part of the intermediate range is [0;1/31]. These two parts are not connective. In the intermediate range of the discontinuity [1/32;2/32], the concatenation of inverse modified pre-function and main function cannot be calculated since the modified pre-function is not invertible at the discontinuity. However, the delimiting LUT input grid positions belong either to the first or to the second part of the intermediate range and can be calculated as previously described.

Then the 33×33×33 LUT is built. To this end, the LUT input grid positions and their LUT entries are classified into the following classes:

Pathway positions: grid positions where all three intermediate R,G,B coordinates are within [0;1/32]; and Mainsteam positions: All grid positions where all three intermediate R,G,B coordinates are within [2/32;1].

As before, the mainstream positions are not in the second part of the intermediate range and are calculated in any conventional manner. The pathway positions, however, are calculated for R,G,B coordinates according the following linear function, respectively:

$$z = \frac{Q^{-1}(1/32)}{1/32} w$$

By this choice, the pathway maps the input without alteration to the output. In the second part of the input signal range, the input signal is not modified by the processing and no LUT interpolation errors impact the signal. However, as already explained, in practical implementations, the input signal may be impacted by noise stemming from the limited precision of floating point operations.

FIG. 5 illustrates that the LUT entries controlling the first part of the intermediate signal range and the LUT entries that control the second part of the intermediate signal range are distinct. The transition between first and second parts of the intermediate signal range can be designed in two ways, described hereafter.

A first way is to choose the LUT entries such that the transition is smooth so that the LUT entries for w=1/32 and w=2/32 are be identical, which is not the case in FIG. 5. One way to make the transition smooth is to align the LUT entry for w=1/32 to that for w=2/32 which is calculated using the inverse pre-function and the main function. An advantage is that the mainstream signal, i.e. that of the first part of the signal range, is transformed in the normal way. A disadvantage is that the linear pathway for one coordinate within the second part of the signal range may depend on another coordinate of the signal if the main function or the pre-function have cross talk. It is also possible to align the LUT entry for w=2/32 to that for w=1/32 which is calculated according to a linear function. An advantage is that the linear pathway does not at all depend on the main function and can be designed with any degree of freedom. A disadvantage is that the mainstream signal, i.e. that of the first part of the signal range, is influenced for small values by the LUT entries controlling the linear pathway. However, when making the transition in the LUT smooth, the discontinuity within the pre-function has no technical effect apart from reducing the number of freely available LUT entries. It can be preferable to abstain from introducing a discontinuity into the pre-function.

A second way is to choose the LUT entries such that the transition is discontinued. In FIG. 6, the LUT entries for w=1/32 and w=2/32 are not identical, the transition is discontinued. An advantage is that the behavior of the LUT can be independently chosen for the first and second parts of the signal range, respectively. A disadvantage is that the output signal will expose a discontinuity when the input signal passes from the first to the second part of the input signal range or vice versa.

Figure 7:
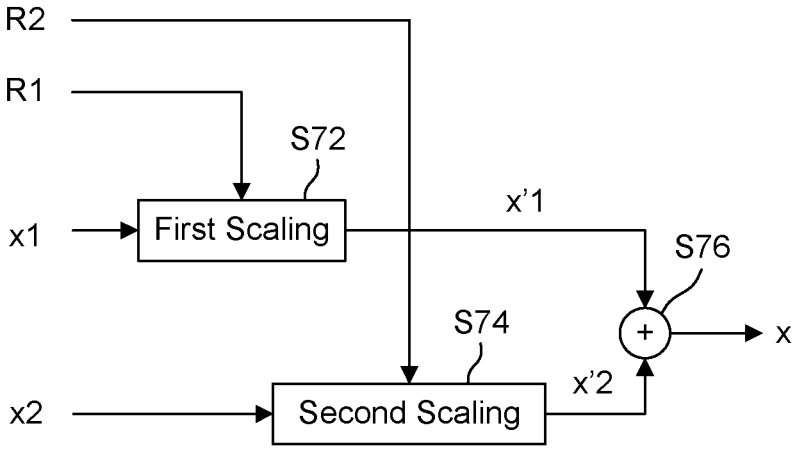
FIG. 7 illustrates pre-processing in a two-signal embodiment of the present principles.

FIG. 7 illustrates pre-processing in a two-signal embodiment of the present principles. In the embodiment, the pre-function and the LUT are applied to both a main input signal and another input signal such that the other input signal is passed through in a linear manner without any LUT interpolation error.

To achieve this, the main signal x1 is scaled S72 using range information R1 so that the resulting scaled main input signal x'1 fits within the first part of the input signal range, and the other input signal x2 is scaled S74 using range information R2 so that the resulting scaled other input signal x'2 fits within the second part of the input signal range. The scaled main input signal and the scaled other input signal are added S76 to obtain a joint input signal x.

The pre-function and the LUT are applied to the joint input signal x, as previously described, resulting in an output signal z.

Figure 8:
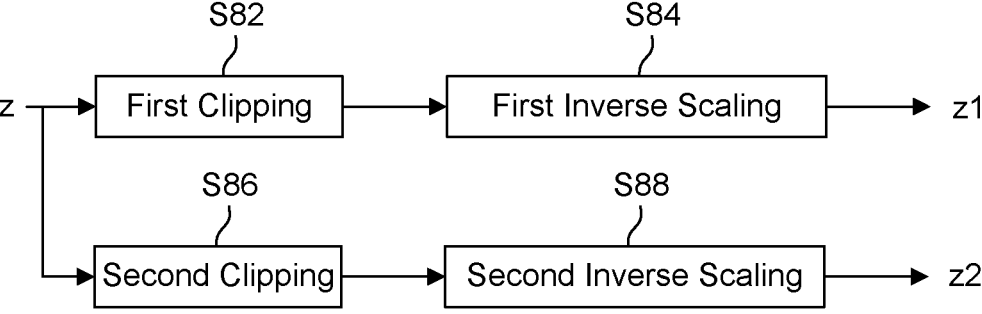
FIG. 8 illustrates post-processing in a two-signal embodiment of the present principles.

FIG. 8 illustrates post-processing in the two-signal embodiment of the present principles. The output signal is clipped S82, "first clipping", at the borders of the first part of the output signal range and first inverse scaled S84 according to the inverse of the scaling of the main signal, resulting in a main output signal z1. Similarly, the output signal is clipped S86, "second clipping", at the borders of the second part of the output range and second inverse scaled S88 according to the inverse of the scaling of the other signal, resulting in another output signal z2.

As already explained, the first part of the output range is the range of values after having applied the modified pre-function and the LUT to input values that are within the first part of range of the input signal, and the second part of the output range is the range of values after having applied the modified pre-function and the LUT to input values that are within the second part of the input signal range.

The clipping requires range information of the first and second parts of the range of the output signal; the first part is the range of values after having applied the modified pre-function and the LUT to input values that are within the first part of range of the input signal and the second part is the range of values after having applied the pre-function and the LUT to input values that are within the second part of the input signal range.

The inverse scalings are preferably the inverse of the scalings, respectively, which requires the transformation consisting of pre-function and LUT to be range preserving. However, if the transformation is not range preserving, the inverse scalings can be adapted accordingly. For example, if the main input signal is a standard dynamic range (SDR) video signal and the transformation is a so-called inverse tone mapping increasing the range by a factor of ten in order to create a high dynamic range (HDR) video signal, the first inverse scaling can be chosen to be the concatenation of a division by ten, followed by the inverse first scaling, followed by a multiplication by ten.

The scalings and the inverse scalings are preferably linear operations, but it is also possible to use non-linear scalings and corresponding non-linear inverse scalings.

Implementation Example 5

In implementation example 5, the main input signal is a black and white video signal v(t) with values in the range of [0;1] and the other input signal is a normalized temperature measurement signal k(t) that is defined according to $$k(t)=(T(t)+100)/200$$

where T(t) is the measured temperature at time t in a range of [−100° C.; 100° C.]. The signal k(t) has a range of [0;1]. Both signals pass through a single transformation consisting of a pre-function and a LUT.

The information on the first and second parts of the input signal range, respectively, can be obtained as follows: the first part of the input signal range is characterized by values within [0;9], whereas the second part of the range of the input signal is [9;10].

The video signal is scaled into a scaled video signal V'(t) using $$v'(t) = \frac{9}{1} v(t).$$

The temperature measurement signal is scaled into a scaled temperature measurement signal k'(t) using $$k'(t) = 9 + k(t).$$

The scaled video signal and the scaled temperature measurement signal are added as follows resulting in input signal x(t):

$$x(t) = v'^{(t)} + T'(t).$$

This input signal has a range [0;10] were the video signal is packed into the first part [0;9] and the temperature signal in the second part [9;10] of the input signal range.

The pre-function and the LUT are calculated as previously described and are applied to the input signal resulting in an output signal z(t).

The output signal z(t) is first clipped and first inverse scaled. In this example, it is assumed that the main function is range preserving; the first part of the output signal range is [0;9]. The first clipping then sets all signal values to 9 that are larger than 9 and all signal value to zero that are smaller than zero. The first inverse scaling is the inverse of the first scaling. In this way, the following first output signal z1(t) is obtained which corresponds to the processed video input signal:

$$z1(t) = \frac{1}{9}\begin{cases} 0 & z(t) < 0 \\ z(t) & \text{else} \\ 9 & z(t) > 9 \end{cases}$$

Similarly, the output signal is second clipped and second inverse scaled. The second part of the output signal range is [9;10]. The second clipping then sets all signal values to 10 that are larger than 10 and all signal value to 9 that are smaller than 9. The second inverse scaling is the inverse of the second scaling. In this way, the second output signal z2(t) is obtained; it is identical to the temperature measurement signal k(t) and does not have any interpolation errors:

$$z2(t) = -9 + \begin{cases} 9 & z(t) < 9 \\ z(t) & \text{else} \\ 10 & z(t) > 10 \end{cases}$$

It is noted that when the LUT is calculated in this embodiment, it can be advantageous to use a scaled main function instead of the main function itself. The scaled main function is the concatenation of the inverse of the first scaling and the main function. In this case, the first output signal z1 (t) corresponds to the video input signal after application of the main function, up to LUT interpolation errors.

Implementation Example 6

In implementation example 6, a two-dimensional main function used in food processing industry will be implemented as LUT using a one-dimensional pre-function for one channel only. The present principles can allow to handle the precision limits of the main function with respect to physical principals.

In this example, the two-dimensional signal x=(T,D) includes of a measured temperature t in ° C. of a liquid in and a measured raw density d in ° P of the liquid. The signal is limited within 0<=D<=25 and 0<=T<=40.

Such measures are common in food beverage processing in order to determine the content of sugar in the liquid. If the liquid is wort for beer brewing, the raw density in ° P represents the % of weight of sugars in the liquid compared to the total weight of the liquid. Such a raw density is derived from a measurement element, having a predefined density, that swims in the wort having a raw density to be measured. However, the true sugar density s in ° P is not identical to the measured raw density d but should be derived using the following function:

$$S = g(D, T) =$$

$$\left(1 + 0{,}0163141360621 * D - 0{,}00239041142713 * D^2 + 0{,}00016440975721 *\right.$$

$$D^3 - 0{,}00000522728948457 * D^4 + 0{,}0000000634895078767 * D^5\right) *$$

$$\left(0{,}0562740102259 * (T - 20) + 0{,}000883563394687 * (T - 20)^2 +\right.$$

$$0{,}000386930683749 * (T - 20)^3 - 0{,}000000117449629172 * (T - 20)^4 +$$

$$0{,}955584229225 * D\right) + 0{,}0414886678526$$

In this example, the main function is (S,T)=f(D,T)=(g(D, T),T). This main function is implemented as a LUT using a pre-function D'=Q(D,T) for the density channel in order to increase the density precision since the main function is highly non-linear with respect to the density. First this pre-function is applied according to $$w = (D', T) = (Q(D), T).$$

Then, the LUT is applied to (D'T). As already explained, the LUT is constructed from the corresponding "adapted function"

$$f_w(w) = f_w(D', T) = f_w(Q^{-1}(D), T)$$

in order to undo the effect of the applied pre-function.

According to the present principles, the input signal (D,T) comprises a first part where 2<D<19 and 10<T<35. In this part, the main function is physically valid with respect to a tolerated maximum error. All signals not belonging to the first part belong to a second part. For signals in the second part of the range, the main function may not be precise enough for a given application of production control in food industry. For the second part of the signal range, it can be favorable to not apply the main function but to pass the input values without any processing. This way, the signal can be processed later with more effort and higher precision. For example, the pre-function and the LUT is implemented on an embedded system close to the product lines, whereas further processing is done in a distant data center and/or offline.

For the second part of the input signal, a transparent and linear path is integrated into the pre-function and into the LUT. The LUT is implemented as a 16×16 two-dimensional, non-regular LUT having a LUT input range of [0,40]. While this is adapted for the temperature, the pre-function $Q(x)$ should map the input signal range to an intermediated range of [0,40] for the density channel. In order to implement the transparent path, a second pre-function $P(x)$ is used instead of the given pre-function $Q(x)$ according to:

$$P(D, T) = Q(D, T) \text{ for } 2 < D < 19 \text{ and } 10 < T < 35$$

$$P(D, T) = D * 40/25 \text{ else}$$

resulting in a signal $w=(P(D,T),T)$.

The LUT has in the D-channel a specific first segment for the intermediated range $0<P(D,T)<=2*40/25$ and a specific last segment for the intermediated range $19*40/25<P(D,T)<40$. The first and last segments of the LUT belong to the second part of the intermediate signal range. Additionally, all LUT segments with $T<=10$ and $T>=35$ are not calculated using the adapted function $f_w(w)=f_w(D',T)=f_w(Q^{-1}(D),T)$ but using a transparent function $t_w(w)=t_w(D',T)=t_w(Q^{-1}(D),T)=(Q^{-1}(D),T)$. The transparent function just undoes the pre-function and passes by the density without processing. For the application of the LUT, linear interpolation, is used.

In this way, neither the pre-function nor the LUT modifies the input signal that is passed by in a linear manner to the LUT output without any modification nor any LUT interpolation error.

Figure 9:
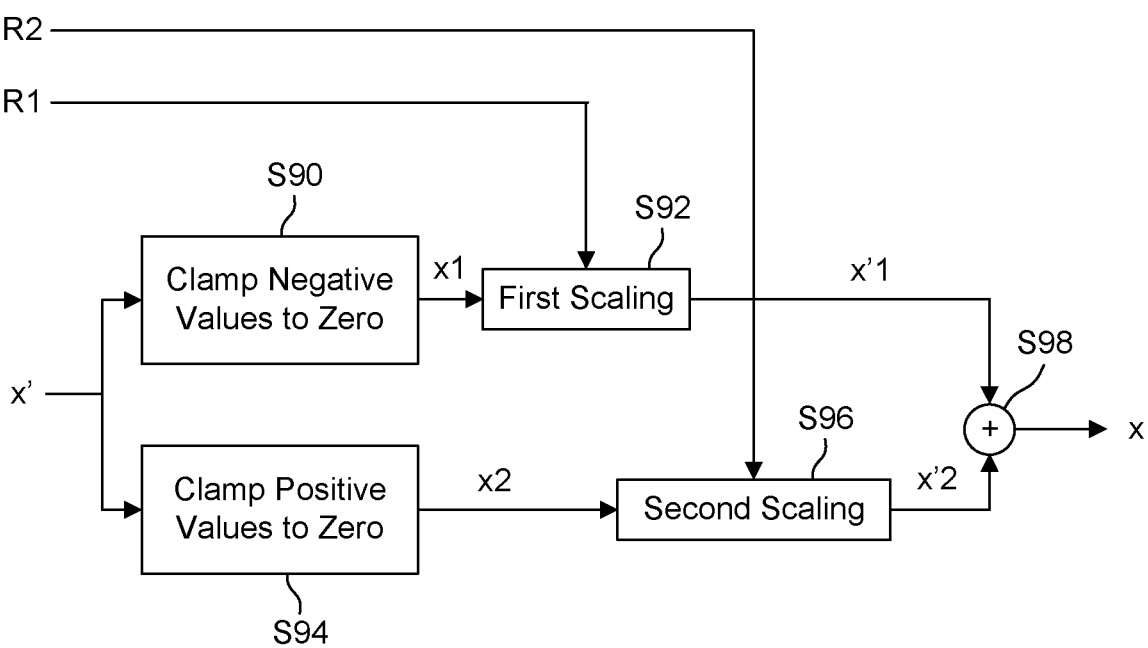
FIG. 9 illustrates pre-processing in an embodiment of the present principles allowing positive and negative input values.

FIG. 9 illustrates pre-processing in an embodiment of the present principles allowing positive and negative input values. In the embodiment that can be said to be an extension of the embodiment illustrated in FIGS. 7 and 8, the main input signal is the positive part of a pre-input signal x' and the other input signal is the negative part of the same pre-input signal x' (or vice versa). These signals can be processed as follows.

The device receives information R1 about a signal footroom at the lower end of the positive part of the range of the input signal, clamps S90 negative values of the pre-input signal x' to zero to obtain a positive signal x1, i.e. the positive part of the pre-input signal x', that is first scaled S92 resulting in a scaled positive input signal x'1 that is outside the signal footroom.

The device receives information R2 about the signal range of the other input signal x', clamps S94 positive values of the pre-input signal x' to zero to obtain a negative signal x2, i.e. the negative part of the pre-input signal x', that is scaled S96, resulting in a scaled negative input signal x'2 that fits within the footroom.

The scaled positive input signal x'1 and the scaled negative input signal x'2 are added (S98), resulting in a joint input signal x.

The pre-function and the LUT are applied to the joint input signal x, as previously described, resulting in a preliminary output signal z.

Figure 10:
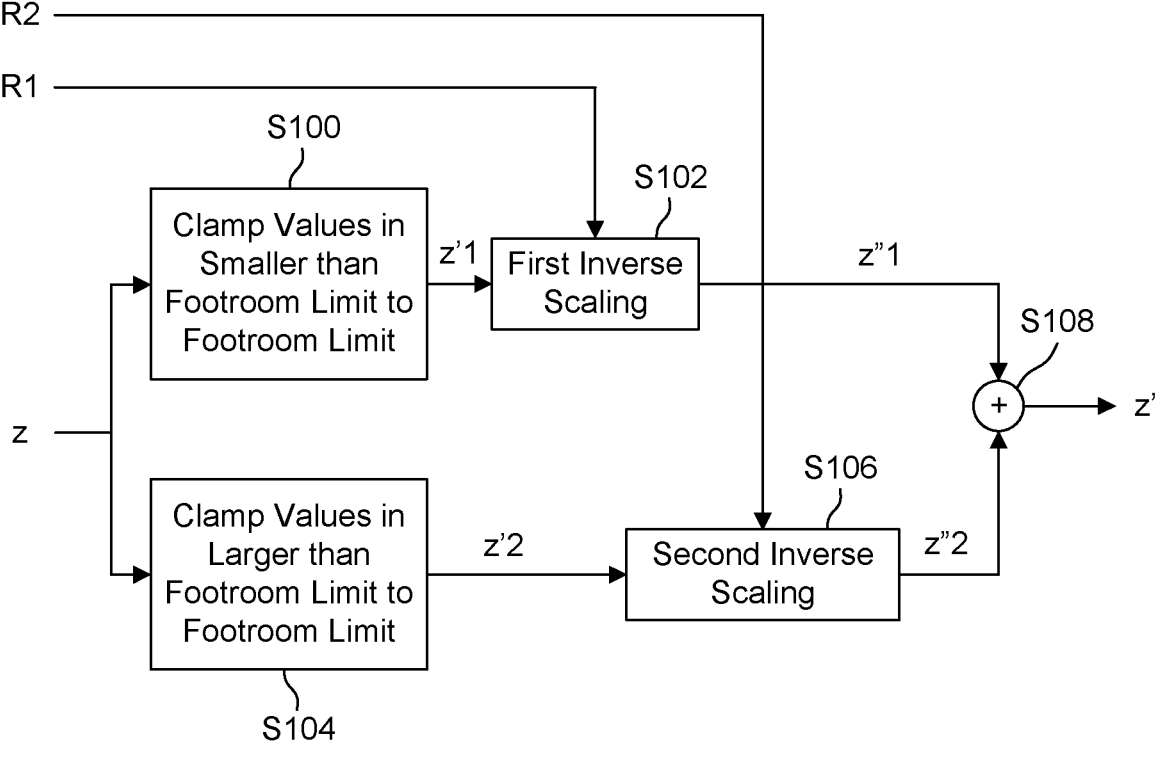
FIG. 10 illustrates post-processing in the embodiment of the present principles allowing positive and negative input values.

FIG. 10 illustrates post-processing in the embodiment of the present principles allowing positive and negative input values.

The preliminary output signal z is first clamped S100 to set values smaller than the footroom limit to the footroom limit to obtain a first clamped output signal z'1 that is first inverse scaled S102, using the information R1 about the signal footroom and the inverse scaling, to obtain a first processed preliminary output signal z"1.

Similarly, the preliminary output signal z is also second clamped S104 to set values larger than the footroom limit to the footroom limit to obtain a second clamped output signal z'2 that is second inverse scaled S106, using the information R2 about the signal footroom and the inverse scaling, to obtain a second processed preliminary output signal z"2.

The first processed preliminary output signal z"1 and the second processed preliminary output signal z"2 are then added (S108) to obtain an output signal z'.

It is noted that the embodiment that preserves the negative part of an input signal can also be relaxed with respect to the definition of the negative part. For example, it may be desired to include also small positive values in the "negative part" that thus does not have as upper bound zero but a small, positive value, for example 0.00025. This can be achieved by making the first part of the input signal range encompass all negative values and all positive values smaller than 0.000025, while the second part of the input signal range encompasses all positive values equal or larger than 0.000025.

Roundtrip operations are used when an original signal of a first type is first transformed into a signal of a second type that then is transformed back into a reconstructed signal of the first type. Often, a requirement is that the reconstructed signal is close to the original signal. Reasons for roundtrip operations can include that the second type of a signal is better adapted for transmission, for storage, for editing or that is second type is a commonly used type and thus, the roundtrip operation allows to transform temporally the signal of a first type into a signal that is compatible with this common type. In this embodiment, the first output signal is a signal of the second type.

The embodiment can thus be used in order to realize a roundtrip operation, as follows.

The described pre-processing is applied to the input signal to compress the negative part of the input signal into a positive footroom, resulting in a first modified input signal to which a first pre-function and a first LUT (derived from a main function) are applied resulting in a preliminary first output signal, thereby preserving the signal footroom. The described post-processing is then applied to the preliminary first output signal to reconstruct the negative part, resulting in a first output signal.

The described pre-processing is applied to the first output signal in order to compress the negative part of the first output signal into a positive footroom, resulting in a second modified input signal to which a second pre-function and a second LUT (derived from a second main function and the inverse of the second pre-function according as is known in the art, the second main function being the inverse of the main function) are applied, resulting in a preliminary second output signal, thereby preserving the signal footroom.

The described post-processing is applied to the preliminary second output signal in order to reconstruct the negative part resulting in a second output signal.

The mentioned first output signal corresponds in its positive values to the input signal with the main function applied to the positive values, up to LUT interpolation errors. The mentioned first output signal corresponds in its negative values to the negative part of the input signal without any LUT interpolation errors.

It will be appreciated that the present principles can provide a solution for which a part of the range of an input signal can be passed linearly through a LUT-based transformation without any LUT interpolation errors. In an embodiment, two distinct signals can be passed through the same LUT-based transformation, one according to the functional behavior of a main function, and the other in a linear way without any LUT interpolation error. In another embodiment, negative signal values can be passed through a LUT-based transformation without any modification nor LUT interpolation errors. In another embodiment, a part of the range of an input signal can be passed linearly through a LUT-based transformation and an inverse LUT-based transformation without any modification nor LUT interpolation errors.

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces.

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The invention claimed is:

1. A signal processing method comprising:
applying a pre-function to an input signal to obtain an intermediate signal, the pre-function comprising a first part and a second part respectively corresponding to a first part and a second part of a range of the input signal, wherein the pre-function is linear in the second part; and
applying a look-up table, LUT, to the intermediate signal to obtain an output signal, wherein the LUT corresponds to the pre-function and comprises a first part and a second part, wherein the second part is a linear part that comprises entries that delimit a range of the intermediate signal that corresponds to the second range of the input signal, and wherein the pre-function and the LUT are arranged so that the output signal is equal to the input signal for input signals in the second part.

2. The method of claim 1, wherein applying the LUT comprises linear interpolation for intermediate signal values whose values correspond to the second part of the LUT.

3. The method of claim 1, wherein the pre-function and the LUT are non-linear for at least a section of the first part.

4. The method of claim 1, wherein the pre-function comprises a discontinuity between an end of the first part of the range of the input signal and an adjacent end of the second part of the range of the input signal.

5. The method of claim 4, wherein the first part of the LUT comprises an entry with an input value corresponding to a value at the end of the first part bordering on the discontinuity.

6. The method of claim 1, wherein the output signal is equal to the input signal for input signals in the second part barring arithmetic errors due to limited precision in a representation of floating point numbers.

7. The method of claim 1, further comprising:
receiving a first pre-scaled signal and a second pre-scaled signal;
first scaling the first pre-scaled signal to obtain a first scaled signal, wherein the first scaling uses first range information so that the first scaled signal fits into the first part;

second scaling the second pre-scaled signal to obtain a second scaled signal, wherein the second scaling uses second range information so that the second scaled signal fits into the second part; and adding the first scaled signal and the second scaled signal to obtain the input signal.

8. The method of claim 7, further comprising:

first clipping the output signal to obtain a first clipped signal;

first inverse scaling the first clipped signal to obtain a first output signal;

second clipping the output signal to obtain a second clipped signal; and second inverse scaling the second clipped signal to obtain a second output signal;

wherein the first output signal corresponds to the first pre-scaled signal and the second output signal corresponds to the second pre-scaled signal.

9. The method of claim 8, wherein the first inverse scaling is the inverse of the first scaling and the second inverse scaling is the inverse of the second scaling.

10. The method of claim 7, further comprising:

clamping negative values of a pre-input signal to zero to obtain the first pre-scaled signal; and clamping positive values of the pre-input signal to zero to obtain the second pre-scaled signal.

11. A non-transitory computer readable medium storing program code instructions that, when executed by a processor, implement the steps of a method according to claim 1.

12. A device comprising:

memory configured to store processor-executable program code instructions; and at least one hardware processor configured to execute the program code instructions to:

apply a pre-function to an input signal to obtain an intermediate signal, the pre-function comprising a first part and a second part respectively corresponding to a first part and a second part of a range of the input signal, wherein the pre-function is linear in the second part; and apply a look-up table, LUT, to the intermediate signal to obtain an output signal, wherein the LUT corresponds to the pre-function and comprises a first part and a second part, wherein the second part is a linear part that comprises entries that delimit a range of the intermediate signal that corresponds to the second range of the input signal, and wherein the pre-function and the LUT are arranged so that the output signal is equal to the input signal for input signals in the second part.

13. The device of claim 12, wherein application of the LUT comprises linear interpolation for intermediate signal values whose values correspond to the second part of the LUT.

14. The device of claim 12, wherein the pre-function and the LUT are non-linear for at least a section of the first part.

15. The device of claim 12, wherein the pre-function comprises a discontinuity between an end of the first part of the range of the input signal and an adjacent end of the second part of the range of the input signal.

16. The device of claim 15, wherein the first part of the LUT comprises an entry with an input value corresponding to a value at the end of the first part bordering on the discontinuity.

17. The device of claim 12, wherein the output signal is equal to the input signal for input signals in the second part barring arithmetic errors due to limited precision in a representation of floating point numbers.

18. The device of claim 12, wherein the at least one hardware processor is further configured to execute the program code instructions to:

receive a first pre-scaled signal and a second pre-scaled signal;

first scale the first pre-scaled signal to obtain a first scaled signal, wherein first scaling uses first range information so that the first scaled signal fits into the first part;

second scale the second pre-scaled signal to obtain a second scaled signal, wherein second scaling uses second range information so that the second scaled signal fits into the second part; and add the first scaled signal and the second scaled signal to obtain the input signal.

19. The device of claim 18, wherein the at least one hardware processor is further configured to execute the program code instructions to:

first clip the output signal to obtain a first clipped signal;

first inverse scale the first clipped signal to obtain a first output signal;

second clip the output signal to obtain a second clipped signal; and second inverse scale the second clipped signal to obtain a second output signal;

wherein the first output signal corresponds to the first pre-scaled signal and the second output signal corresponds to the second pre-scaled signal.

20. The device of claim 18, wherein the at least one hardware processor is further configured to execute the program code instructions to:

clamp negative values of a pre-input signal to zero to obtain the first pre-scaled signal; and clamp positive values of the pre-input signal to zero to obtain the second pre-scaled signal.

* * * * *